United States Patent
Kitagawa et al.

(10) Patent No.: US 8,985,818 B2
(45) Date of Patent: Mar. 24, 2015

(54) LED MOUNTING SUBSTRATE

(75) Inventors: Daisuke Kitagawa, Osaka (JP);
Yoshinari Takayama, Osaka (JP);
Ichiro Suehiro, Osaka (JP); Hideyuki Usui, Osaka (JP); Takashi Oda, Osaka (JP)

(73) Assignee: Nitto Denko Corporation, Osaka (JP)

( * ) Notice: Subject to any disclaimer, the term of this patent is extended or adjusted under 35 U.S.C. 154(b) by 339 days.

(21) Appl. No.: 13/508,676

(22) PCT Filed: Nov. 26, 2010

(86) PCT No.: PCT/JP2010/006922
§ 371 (c)(1),
(2), (4) Date: May 8, 2012

(87) PCT Pub. No.: WO2011/065016
PCT Pub. Date: Jun. 3, 2011

(65) Prior Publication Data
US 2012/0230043 A1    Sep. 13, 2012

(30) Foreign Application Priority Data
Nov. 26, 2009  (JP) ................. 2009-268723

(51) Int. Cl.
| | |
|---|---|
| H05K 1/03 | (2006.01) |
| C08L 27/18 | (2006.01) |
| H01L 23/373 | (2006.01) |
| H01L 33/60 | (2010.01) |
| H01L 33/64 | (2010.01) |
| H05K 3/00 | (2006.01) |

(52) U.S. Cl.
CPC .............. *H05K 1/0373* (2013.01); *C08L 27/18* (2013.01); *H01L 23/3735* (2013.01); *H01L 33/60* (2013.01); *H01L 33/641* (2013.01); *H05K 3/0061* (2013.01); *H05K 2201/015* (2013.01); *H05K 2201/0209* (2013.01); *H05K 2201/10106* (2013.01); *H01L 2224/48091* (2013.01); *H01L 2924/3025* (2013.01)
USPC ............ 362/382; 524/404; 524/544; 524/546

(58) Field of Classification Search
CPC .............................................. H05K 2201/015
See application file for complete search history.

(56) References Cited

U.S. PATENT DOCUMENTS

| | | | | |
|---|---|---|---|---|
| 5,922,453 | A * | 7/1999 | Horn et al. | ..................... 428/325 |
| 6,143,819 | A | 11/2000 | Nakanishi | |
| 6,831,031 | B2 * | 12/2004 | Ishihara | ....................... 501/96.4 |
| 2006/0180936 | A1 | 8/2006 | Japp et al. | |
| 2008/0057333 | A1 * | 3/2008 | Chu et al. | ....................... 428/612 |

(Continued)

FOREIGN PATENT DOCUMENTS

| | | |
|---|---|---|
| EP | 0 248 617 | 12/1987 |
| JP | 62-283694 | 12/1987 |
| JP | 9-183187 | 7/1997 |
| JP | 2001-247736 | 9/2001 |

(Continued)

*Primary Examiner* — Nicole M Buie-Hatcher
(74) *Attorney, Agent, or Firm* — Hamre, Schumann, Mueller & Larson, P.C.

(57) ABSTRACT

The LED mounting substrate of the present invention includes a thermally conductive layer (thermally conductive sheet (10)) made of a composition containing boron nitride powder and a fluororesin, and the fluororesin contains polytetrafluoroethylene. The thermally conductive layer has a thermal conductivity of 2 W/(m·K) or more. The thermally conductive layer has a reflectance of 0.80 or more at wavelengths of 380 nm, 470 nm, and 650 nm.

7 Claims, 1 Drawing Sheet

(56) References Cited

U.S. PATENT DOCUMENTS

| | | |
|---|---|---|
| 2008/0245949 A1* | 10/2008 | Morimoto et al. ............ 250/205 |
| 2008/0278917 A1 | 11/2008 | Lin et al. |
| 2008/0292857 A1* | 11/2008 | Wang et al. ................... 428/220 |
| 2009/0029176 A1* | 1/2009 | Nishida et al. ................ 428/421 |
| 2009/0135330 A1* | 5/2009 | Kawase et al. ................. 349/58 |
| 2009/0166653 A1* | 7/2009 | Weaver et al. ................. 257/98 |
| 2010/0072416 A1 | 3/2010 | Fujioka et al. |
| 2010/0255742 A1* | 10/2010 | Yun et al. ..................... 442/117 |

FOREIGN PATENT DOCUMENTS

| | | |
|---|---|---|
| JP | 2003-152295 | 5/2003 |
| JP | 2004-335853 | 11/2004 |
| JP | 2006-270002 | 10/2006 |
| JP | 2007-266606 | 10/2007 |
| JP | 2008-071895 | 3/2008 |
| JP | 2008-270709 | 11/2008 |
| JP | 2008-277817 | 11/2008 |
| JP | 2009-032943 | 2/2009 |

\* cited by examiner

LED MOUNTING SUBSTRATE

TECHNICAL FIELD

The present invention relates to LED mounting substrates.

BACKGROUND ART

Light emitting diodes (LEDs) have advantages of small size, long life, and low power consumption. Therefore, LEDs are expected to be the leading next generation light source, and the light emission intensity of LEDs is predicted to increase further. However, as the light emission intensity of LEDs increases, heat generated by the LEDs increases. When heat generated by LEDs increases, the advantages of the LEDs may not be fully exploited. Therefore, the heat generated by the LEDs must be dissipated efficiently. In order to utilize light emitted from LEDs efficiently, it is important to increase the reflectance of a substrate on which the LEDs are mounted. It is also important that the substrate is not significantly degraded or discolored by the light and heat emitted from the LEDs. Furthermore, in the case where the LEDs are used outdoors, it is important that the substrate is not significantly degraded or discolored even if it is exposed to sunlight for a long period of time.

Conventionally, various substrates have been proposed as substrates on which elements such as LEDs are to be mounted (see, for example, Patent Literatures 1 to 4).

CITATION LIST

Patent Literature

Patent Literature 1 JP 2008-270709 A
Patent Literature 2 JP 2006-270002 A
Patent Literature 3 JP 2008-277817 A
Patent Literature 4 JP 2003-152295 A

SUMMARY OF INVENTION

Technical Problem

However, the conventional substrates do not have properties good enough to fully exploit the advantages of LEDs. Under these circumstances, it is an object of the present invention to provide a novel substrate suitable for LED mounting.

Solution to Problem

In order to achieve the above object, the LED mounting substrate of the present invention includes a layer made of a composition containing boron nitride powder and a fluororesin, and the fluororesin contains polytetrafluoroethylene. The layer has a thermal conductivity of 2 W/(m·K) or more, and the layer has a reflectance of 0.80 or more at wavelengths of 380 nm, 470 nm, and 650 nm.

Advantageous Effects of Invention

According to the present invention, a substrate suitable for LED mounting can be obtained. Since the substrate of the present invention has a high thermal conductivity, heat generated by an LED can be dissipated efficiently. Since the substrate of the present invention has a high reflectance, light emitted from an LED can be utilized efficiently. Since the substrate of the present invention has excellent weather resistance, its high reflectance can be maintained even if it is used outdoors. Therefore, the substrate can be used outdoors for a long period of time.

DESCRIPTION OF EMBODIMENTS

Figure 1:
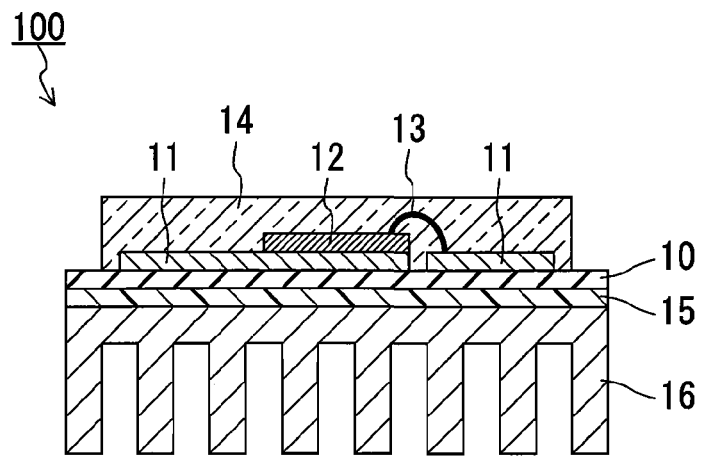
FIG. 1 is a schematic cross-sectional view of an LED module using a substrate of the present invention.

Embodiments of the present invention will be described below. In the following description, the embodiments of the present invention are described by way of examples, but the present invention is not limited to these examples. In the following description, specific numerical values and specific materials may be shown as examples, but other numerical values and other materials may be used as long as the effects of the present invention can be obtained.

(LED Mounting Substrate of the Present Invention)

The substrate of the present invention is a substrate on which a light emitting diode (LED) is to be mounted. This substrate includes a layer made of a composition containing boron nitride (BN) powder and a fluororesin. Hereinafter, this layer may also be referred to as a "thermally conductive layer". The composition that constitutes the thermally conductive layer may also be referred to as a "composition (A)". The fluororesin contained in the composition (A) contains polytetrafluoroethylene (hereinafter also referred to as "PTFE").

A typical example of the thermally conductive layer is sheet-like. The substrate of the present invention may consist of a sheet-like thermally conductive layer. Alternatively, the substrate of the present invention may include other layers and members in addition to the thermally conductive layer. Typically, an LED is disposed on the thermally conductive layer. Other layers such as a wiring pattern may be disposed between the thermally conductive layer and the LED.

The thermal conductivity of the thermally conductive layer is 2 W/(m·K) or more, preferably 3 W/(m·K) or more, and more preferably 5 W/(m·K) or more. There is no upper limit to the thermal conductivity, but the thermal conductivity may be 300 W/(m·K) or less. When the thermal conductivity of the thermally conductive layer is 2 W/(m·K) or more, heat generated by the LED can be dissipated efficiently. The thermal conductivity of the thermally conductive layer can be adjusted by changing the content of the boron nitride powder in the composition (A). For example, the thermal conductivity can be increased by increasing the ratio of the mass of boron nitride powder contained in the composition (A) to the mass of a resin contained in the composition (A). The thermal conductivity can also be adjusted by changing the type and content of an inorganic filler other than the boron nitride powder or the type and content of the resin contained in the composition (A).

The reflectance of the thermally conductive layer is 0.80 or more (in the range of 0.80 to 1) at wavelengths of 380 nm, 470 nm, and 650 nm, and preferably 0.85 or more, or 0.90 or more. In a preferred example, the reflectance of the thermally conductive layer is 0.80 or more (in the range of 0.80 to 1) in the wavelength range of 380 nm to 650 nm, and preferably 0.85 or more, or 0.90 or more. Light emitted from the LED can be utilized efficiently when the thermally conductive layer has a reflectance of 0.80 or more at the wavelengths of light emitted from the LED. When the reflectance is 0.80 or more in the wide wavelength range, the substrate of the present invention can be suitably used as a substrate for various LEDs that emit light at different wavelengths. The reflectance of the thermally conductive layer can be adjusted by changing at least one of the thickness and the porosity of the thermally conductive layer, for example.

PTFE and boron nitride are less susceptible to degradation by ultraviolet light and have excellent weather resistance. Therefore, even if the LED emits ultraviolet light or it is used outdoors, the thermally conductive layer is less likely to degrade and can maintain its high thermal conductivity and high reflectance. As a result, the life of the LED can be extended.

Typically, the thermally conductive layer has insulating properties. The electrical resistivity (volume resistivity) of the thermally conductive layer may be $10^{10}$ Ω·cm or more (for example, $10^{15}$ Ω·cm or more). In the case where the thermally conductive layer has insulating properties, a wiring pattern can be formed on the layer.

In one example of the present invention, the thickness of the thermally conductive layer may be in the range of 0.05 mm to 3 mm or in the range of 0.1 mm to 1 mm.

The fluororesin contained in the composition (A) may contain a fluororesin other than PTFE as long as the effects of the present invention can be obtained. For example, the composition (A) may contain a fluororesin (hereinafter also referred to as a "fusible fluororesin") having a melting point of 320° C. or lower (preferably 260° C. or lower), other than PTFE. Examples of fusible fluororesins include perfluoroalkoxy fluororesins (hereinafter also referred to as "PFA") and tetrafluoroethylene-hexafluoropropylene copolymer (hereinafter also referred to as "FEP"). It should be noted that there are various types of PFA and FEP products having different melting points, and some of them have high melting points. The fluororesin contained in the composition (A) may contain polyvinylidene fluoride (PVDF).

The fluororesin contained in the composition (A) may contain at least one selected from the group consisting of perfluoroalkoxy fluororesins (hereinafter also referred to as "PFA") and tetrafluoroethylene-hexafluoropropylene copolymer (hereinafter also referred to as "FEP). The content of the fusible fluororesins (such as PFA and FEP) in the fluororesin may be 5% by mass or more, or 10% by mass or more. The content may also be 70% by mass or less, 50% by mass or less, or 30% by mass or less.

The porosity (void fraction) of the thermally conductive layer can be reduced by adding fusible fluororesins such as PFA and FEP to the composition (A), and as a result, the thermal conductivity of the thermally conductive layer can be increased. Even when PFA and FEP are added to the composition (A), the porosity of 10% by volume or more (for example, 20% by volume or more) can be obtained. The thermally conductive layer having a porosity of 10% by volume or more (for example, 20% by volume or more) can have pliability and flexibility. It is easy for the thermally conductive layer having a porosity ranging from 5 to 30% by volume (for example, ranging from 10 to 30% by volume or 20 to 30% by volume) to have both a good thermal conductivity and a good reflectance. The adhesion of the thermally conductive layer to metals (for example, metal sheets) can be improved by adding the fusible fluororesins to the composition (A). In this case, it is preferable to use adhesive fusible fluororesins.

At least a part of PTFE contained in the composition (A) may be a crosslinked PTFE. Crosslinked PTFEs can be obtained by chemically crosslinking PTFE. Crosslinked PTFEs are disclosed, for example, in WO 2006/120882 A1.

The adhesion of the thermally conductive layer to metals (for example, metal sheets) and polyimide films can be improved by adding a crosslinked PTFE to the composition (A).

The content of the boron nitride powder in the composition (A) may be in the range of 50 to 95% by mass, in the range of 70 to 90% by mass, or in the range of 80 to 90% by mass. The content of the fluororesin (for example, PTFE) in the composition (A) may be in the range of 5 to 50% by mass, in the range of 10 to 30% by mass, or in the range of 10 to 20% by mass. In an example of the composition (A), the content of the boron nitride powder is in the range of 70 to 90% by mass, and the content of the fluororesin is in the range of 10 to 30% by mass. In this example, the content of components other than the boron nitride powder and the fluororesin may be in the range of 0 to 10% by mass.

There is no particular limitation on the size and shape of particles contained in the boron nitride powder as long as the effects of the present invention can be obtained. In one example of the present invention, the average particle size of the boron nitride powder is in the range of 0.2 μm to 350 μm. The boron nitride particles may be spherical or flaky in shape. The particles may also be in the form of aggregates of particles having such a shape.

An example of the composition (A) consists of boron nitride powder and a fluororesin (for example, PTFE). The composition (A) may contain components other than the above components as long as the effects of the present invention can be obtained. For example, the composition (A) may contain a resin other than the fluororesin. The composition (A) may contain an inorganic filler other than boron nitride. For example, it may contain an insulating inorganic filler other than boron nitride. Examples of such inorganic fillers include silicon nitride ($Si_3N_4$), aluminum oxide ($Al_2O_3$), and aluminum nitride (AlN). Excellent properties may be obtained by using an inorganic filler having a thermal conductivity of 30 W/(m·K) or more. In the composition (A), the content of the components other than the boron nitride powder and the fluororesin is typically 20% by mass or less, and may be 10% by mass or less, or 5% by mass or less. The boron nitride powder and other inorganic fillers are dispersed in the resin constituting the composition (A).

The substrate of the present invention may further include a wiring pattern formed on the surface of the thermally conductive layer. The wiring pattern can be formed of a known material and by a known method. For example, the wiring pattern can be formed by forming a metal thin film by vapor deposition such as sputtering and evaporation and then forming a resist pattern and performing etching.

The substrate of the present invention may be disposed on a radiator. The thermally conductive layer may be laminated on the radiator. The thermally conductive layer may be laminated directly on the radiator, or may be laminated on the radiator with another layer interposed therebetween. In another aspect, the present invention relates to a heat dissipation module including a radiator and a thermally conductive layer disposed on the radiator. In still another aspect, the present invention relates to an LED module including the substrate of the present invention (which may include a radiator) and an LED mounted on the substrate.

There is no limitation on the radiator as long as the heat dissipation performance can be enhanced, and a common metal heat sink can be used therefor. The thermally conductive layer may be disposed on the radiator in contact therewith, or may be disposed on the radiator with another member interposed therebetween. The thermally conductive layer may be disposed on a housing (for example, a metal housing) of a device including an LED. It is possible to prevent the LED from being exposed to high temperatures by disposing the thermally conductive layer on a body having high thermal conductivity and large heat capacity (such as a radiator and a housing).

The substrate of the present invention is less susceptible to degradation by heat and has weather resistance. In a preferred example of the substrate of the present invention, the thermally conductive layer has a reflectance of 0.80 or more (80% or more) at wavelengths of 380 nm, 470 nm, and 650 nm after heating at 200° C. for 72 hours, and a reflectance of 0.80 or more at wavelengths of 380 nm, 470 nm, and 650 nm after heating at 120° C. for 360 hours.

(Production Method of the Substrate of the Present Invention)

An example of the production method of the thermally conductive layer included in the substrate of the present invention is described below. This production method includes the following steps (i) to (iii). Since the substrate of the present invention has already been described above, overlapping descriptions may be omitted.

In the step (i), a plurality of sheets composed of a mixture (also referred to as a "mixture (B)") containing the components of the composition (A) are formed. The mixture (B) contains boron nitride powder and PTFE. A thermally conductive layer having excellent properties may be obtained by using powdery PTFE as the PTFE contained in the mixture (B).

The mixture (B) typically contains a dispersion medium (forming auxiliary agent). There is no limitation on the dispersion medium as long as the substrate of the present invention can be produced. The dispersion medium may be an organic solvent, or may be a nonpolar organic solvent (for example, saturated hydrocarbon). Examples of the dispersion medium include decane and dodecane.

Typically, the components of the composition (A) are contained in the mixture (B) in the same ratio as in the composition (A). The content of the dispersion medium in the mixture (B) is not particularly limited, and for example, it may be in the range of 20 to 55% by mass.

In an example of the step (i), first, the components of the composition (A) and the dispersion medium are mixed to prepare the mixture (B). Then, the mixture (B) is rolled into a sheet. In the step (i), a plurality of sheets are formed. It is preferable to prepare the mixture (B) under the conditions in which the fluororesin is less likely to become fibrous. When the materials are mixed in a mixer, it is preferable to perform the mixing at a low rotation speed (for example, at 1000 rpm or less) for a short time (for example, 10 minutes or less).

In the step (ii), a laminated sheet is formed by stacking a plurality of sheets (sheets formed in the step (i)) and rolling the stack of sheets. A multilayer sheet is obtained by the step (ii). A plurality of sheets are obtained by cutting the sheet obtained in the step (ii) or by repeating the step (ii) two or more times. The step (ii) may be repeated using the plurality of sheets thus obtained as the sheets to be stacked and rolled in the step (ii). A sheet having an increased number of laminated layers can be obtained by repeating the step (ii) in this manner. For example, when a stack of two sheets is rolled in the step (ii), a two-layer laminated sheet is obtained. When the step (ii) is performed using the stack of the two two-layer laminated sheets, a four-layer laminated sheet is obtained. When a stack of two sheets is rolled in the step (ii) in this manner, a $2^n$-layer laminated sheet is obtained by repeating the step (ii) n times. When a stack of three sheets is rolled in the step (ii), a $3^n$-layer laminated sheet is obtained by repeating the step (ii) n times. In a sheet having many laminated layers, the components may become mixed almost homogeneously, which makes it difficult to recognize the layered structure.

The number of laminated layers of the sheet may be in the range of 10 to 5000 (for example, in the range of 200 to 1000). The strength of the sheet can be increased by increasing the number of laminated layers to 200 or more. In an example of the thermally conductive layer, the thickness is in the range of 0.1 mm to 3 mm and the number of laminated layers is in the range of 200 to 1000.

The step (iii) for removing the dispersion medium from the sheet obtained by the step (ii) may be performed, if necessary. For example, the dispersion medium is removed by heating the sheet at a temperature lower than the melting temperatures of the components of the composition (A).

After the step (ii) or the step (iii), a step (iv) for rolling the sheet that has undergone these steps may be performed, if necessary.

A thermally conductive layer to be used in the substrate of the present invention is obtained by the above steps. A sheet (thermally conductive layer) having particularly excellent properties may be obtained by forming the mixture (B) into a sheet having 200 or more laminated layers by the above steps. The thermally conductive layer produced by the above production method exhibits excellent properties. A substrate including the thermally conductive layer produced by the above production method constitutes one aspect of the substrate of the present invention.

EXAMPLES

Examples of the present invention are described below.

Example 1

In Example 1, a thermally conductive sheet (thermally conductive layer) was formed by the following method. First, boron nitride powder ("UHP-1" (trade name) manufactured by Showa Denko K.K.), PTFE powder ("F104U" (trade name) manufactured by Daikin Industries, Ltd.), and PFA ("MP-10" (trade name) manufactured by Du Pont-Mitsui Co., Ltd.) were mixed in a ratio (mass ratio) of 80:10:10. 100 parts by mass of this mixture was kneaded with 60 parts by mass of decane. Thus, a pasty mixture was obtained. A V-blender was used to mix the materials. The mixing was performed under the conditions of a rotation speed of 10 rpm and a temperature of about 25° C. for 1 minute. The boron nitride powder (UHP-1) was observed with a scanning electron microscope (SEM), and it was found that the boron nitride powder was a type of powder in the form of flaky particles. The particle size distribution of the boron nitride powder (UHP-1) was measured by the laser diffraction-scattering method (Microtrac method) and the arithmetic average particle size was calculated. A laser diffraction-scattering type Microtrac particle size distribution analyzer ("SRA200" manufactured by Nikkiso Co., Ltd.) was used for the measurement. The arithmetic average particle size thus calculated was 13 μm.

The pasty mixture thus obtained was passed through pressure rolls, and thereby two sheets with a thickness of 3 mm were formed. Next, these two sheets were stacked and rolled, and thereby a first laminated sheet having two laminated layers was formed. Next, the first laminated sheet was cut into two sheets and these two sheets were stacked and rolled, and thereby a second laminated sheet having four laminated layers was formed. A series of these processes of cutting, stacking, and rolling was repeated five times by changing the rolling direction by 90 degrees each time it was repeated. The resulting laminated sheet was rolled two or more times to produce a laminated sheet with a thickness of 0.8 mm.

Next, the laminated sheet thus obtained was heated at about 150° C. for 20 minutes. Decane was removed from the laminated sheet by this heating. Next, the resulting sheet was subjected to pressure forming under the conditions of 380° C. and 10 MPa for 5 minutes. Thus, a thermally conductive sheet (thermally conductive layer) of Example 1 was obtained.

The thermal conductivity, the volume resistivity and the reflectance at wavelengths of 380 nm, 470 nm, and 650 nm of the thermally conductive sheet of Example 1 were measured. The thermal conductivity was measured by the laser flash method. The thermal conductivity was measured using a xenon flash analyzer ("LFA 447 NanoFlash" manufactured by NETZSCH). The volume resistivity was measured using a resistivity meter ("Hiresta MCP-HT450" manufactured by Mitsubishi Chemical Analytech Co., Ltd.) with a URS probe. The reflectance was measured using a UV/VIS spectrophotometer ("V-570" (equipped with an integrating sphere "ISN-470") manufactured by JASCO Corporation). For the measurement of the reflectance, a Spectralon white reference panel (manufactured by Labsphere, Inc.) was used in the integrating sphere, and the reflectance values were calculated relative to the 100% reflectance of the white reference panel.

Next, an LED module 100 shown in FIG. 1 was fabricated using the above thermally conductive sheet (thermally conductive layer). The LED module 100 includes a thermally conductive sheet (thermally conductive layer) 10, a wiring pattern 11, an LED chip 12, a wire 13, a sealing resin 14, a sheet 15, and a heat sink (radiator) 16. The fabrication method of the LED module 100 is described below.

First, an about 50 mm square thermally conductive sheet 10 was cut out from the thermally conductive sheet of Example 1 formed by the above method. The surface of this sheet was subjected to oxygen plasma treatment for 45 seconds. The oxygen plasma treatment was performed under the conditions of 2.5 Pa and 300 W with an oxygen gas flow rate of 50 sccm. Subsequently, the surface of the sheet was subjected to argon plasma treatment for 45 seconds. The argon plasma treatment was performed under the conditions of 2.5 Pa and 300 W with an argon gas flow rate of 50 sccm.

Next, the wiring pattern 11 was formed on one surface (plasma-treated surface) of the thermally conductive sheet 10 by a known method. The LED chip 12 ("EZ1000" manufactured by Cree, Inc.) was die-bonded on this wiring pattern 11. Next, the wiring pattern 11 and the electrode terminal of the LED chip 12 were connected by the wire 13. Next, the LED chip 12 was sealed with the sealing resin 14 (silicone elastomer).

Next, the thermally conductive sheet 10 on which the LED chip 12 was mounted was disposed on the aluminum heat sink 16 with the sheet 15 interposed therebetween. As the heat sink 16, a heat sink (HM-01) manufactured by Ainex, Co., Ltd. was used. As the sheet 15, a sheet ("HT-100HL" manufactured by Nittoshinko Corporation) containing a silicone resin as a matrix resin was used. Thus, the LED module 100 was fabricated.

The LED chip 12 of the LED module 100 was caused to emit light for 10 minutes with 0.5 A or 1 A, and then the maximum temperature of the LED module 100 was measured by thermography. At this time, the temperature was calculated assuming that the emissivity was 0.98.

Example 2

A thermally conductive sheet (thermally conductive layer) of Example 2 was formed in the same manner as in Example 1, except that the boron nitride powder was replaced with boron nitride powder (HP-40) manufactured by Mizushima Ferroalloy Co., Ltd. Boron nitride (HP-40) used in Example 2 is in the form of aggregates of flaky particles. The thermal conductivity, the volume resistivity, and the reflectance of the thermally conductive sheet of Example 2 were measured in the same manner as in Example 1. The boron nitride powder (HP-40) was observed with a scanning electron microscope (SEM), and it was found that the boron nitride powder was a type of powder in the form of aggregates of flaky particles. The arithmetic average particle size of the boron nitride powder (HP-40) was calculated in the same manner as in Example 1, and the arithmetic average particle size was 20 µm.

An LED module of Example 2 was fabricated in the same manner as in Example 1, except that the thermally conductive sheet of Example 2 was used instead of the thermally conductive sheet of Example 1. After the LED was caused to emit light, the maximum temperature of the LED module of Example 2 was calculated in the same manner as in Example 1.

Comparative Example 1

In Comparative Example 1, a white substrate (CS-3965) manufactured by Risho Kogyo Co., Ltd. was used instead of the thermally conductive sheet 10. This white substrate is a substrate made mainly of glass epoxy containing titanium oxide powder and alumina powder. The thermal conductivity, the volume resistivity, and the reflectance of this white substrate were measured in the same manner as in Example 1. An LED module of Comparative Example 1 was fabricated in the same manner as in Example 1, except that this white substrate was used instead of the thermally conductive sheet 10 of Example 1. After the LED was caused to emit light, the maximum temperature of the LED module of Comparative Example 1 was calculated in the same manner as in Example 1.

Comparative Example 2

In Comparative Example 2, a thermally conductive sheet was fabricated using boron nitride powder and polyimide. Specifically, first, an N-methyl-2-pyrrolidone solution of polyamide acid, which is a precursor of thermoset polyimide, (with a polyamide acid concentration of 20% by mass), was prepared. Boron nitride powder ("UHP-1" (trade name) manufactured by Showa Denko K.K.) was added to this solution to prepare a mixed solution. At this time, the boron nitride powder was added so that the content of boron nitride in the final thermally conductive sheet was 45% by volume.

Next, the above mixed solution was applied to a glass substrate to be 110 mm square and 650 µm thick. The glass substrate was heated on a hot plate at 120° C. for 30 minutes to evaporate the solvent. Thus, a film was obtained. Then, the film was heated at 320° C. for 12 minutes to imidize polyamide acid in the film. The thermally conductive sheet of Comparative Example 2 composed of boron nitride powder and polyimide was obtained in this manner. The thermally conductive sheet of Comparative Example 2 was 70 mm square in size and its thickness was about 130 µm.

The thermal conductivity, the volume resistivity, and the reflectance of the thermally conductive sheet of Comparative Example 2 were measured in the same manner as in Example 1. An LED module of Comparative Example 2 was fabricated in the same manner as in Example 1, except that the thermally conductive sheet of Comparative Example 2 was used instead of the thermally conductive sheet of Example 1. After the LED was caused to emit light, the maximum temperature of the LED module of Comparative Example 2 was calculated in the same manner as in Example 1.

Comparative Example 3

In Comparative Example 3, a PTFE sheet (NITOFLON No. 900UL, with a thickness of 250 μm, manufactured by Nitto Denko Corporation) was used instead of the thermally conductive sheet 10. The thermal conductivity, the volume resistivity, and the reflectance of this sheet were measured in the same manner as in Example 1. An LED module of Comparative Example 3 was fabricated in the same manner as in Example 1, except that this sheet was used instead of the thermally conductive sheet 10 of Example 1. The LED of the LED module of Comparative Example 3 was caused to emit light under the same conditions as in Example 1. However, the LED went out soon after it lighted up. The LED failed and became unusable.

Table 1 shows the fabrication conditions and evaluation results of the thermally conductive sheets of Examples and Comparative Examples.

In all Examples 1 and 2 and Comparative Examples 1 to 3, the volume resistivities were $10^{15}\,\Omega\cdot\text{cm}$ or more.

As shown in Table 1, the thermally conductive sheets (thermally conductive layers) of Examples exhibited thermal conductivities of 2 W/(m·K) or more. In contrast, the thermal conductivity of the thermally conductive sheet of Comparative Example 1 was remarkably low. As a result, when LEDs were caused to light up with an electric current of 1 A, differences of 10° C. or more occurred between the maximum temperatures of the modules of Examples and the maximum temperature of the module of Comparative Example 1. The maximum temperatures of the modules of Examples can be lowered by 10° C. or more than the maximum temperature of the module of Comparative Example 1. Therefore, the thermal damage to the LEDs can be reduced, resulting in longer life of the LEDs.

As shown in Table 1, the reflectances of the thermally conductive sheets of Examples were 0.80 or more (80% or more) at wavelengths of 380 nm, 470 nm, and 650 nm. In contrast, the reflectances of the thermally conductive sheets of Comparative Examples were lower, and the reflectance of the thermally conductive sheet of Comparative Example 2 was particularly low.

Furthermore, the above thermally conductive sheets of Examples and Comparative Examples were subjected to a heat test at 200° C. for 72 hours and a heat test at 120° C. for 360 hours. Table 2 shows the reflectances of these thermally conductive sheets after the heat tests.

TABLE 1

|  | Composition of thermally conductive sheet | Properties of thermally conductive sheet | | | | | Maximum temperature of module [° C.] | |
|---|---|---|---|---|---|---|---|---|
|  |  | Thickness [mm] | Thermal conductivity [W/(m·K)] | Reflectance [%] | | | | |
|  |  |  |  | 380 nm | 470 nm | 650 nm | 0.5 A | 1 A |
| Example 1 | PTFE:PFA:BN = 10:10:80 | 0.28 | 3.7 | 83 | 87 | 94 | 70 | 140 |
| Example 2 | PTFE:PFA:BN = 10:10:80 | 0.35 | 7.8 | 85 | 87 | 90 | 65 | 142 |
| Comparative Example 1 | White substrate (CS-3965) | 0.11 | 0.34 | 78 | 87 | 84 | 75 | 156 |
| Comparative Example 2 | Polyimide and BN | 0.13 | 4.3 | 9 | 12 | 52 | 80 | 155 |
| Comparative Example 3 | No. 900UL | 0.25 | 0.23 | 57 | 49 | 38 | — | — |

TABLE 2

|  | Initial reflectance [%] | | | Reflectance [%] after heat test at 200° C. for 72 hours | | | Reflectance [%] after heat test at 120° C. for 360 hours | | |
|---|---|---|---|---|---|---|---|---|---|
|  | 380 nm | 470 nm | 650 nm | 380 nm | 470 nm | 650 nm | 380 nm | 470 nm | 650 nm |
| Example 1 | 83 | 87 | 94 | 83 | 86 | 93 | 84 | 86 | 92 |
| Example 2 | 85 | 87 | 90 | 85 | 88 | 91 | 87 | 88 | 90 |
| Comparative Example 1 | 78 | 87 | 84 | 8 | 9 | 25 | 23 | 58 | 76 |
| Comparative Example 2 | 9 | 12 | 52 | 7 | 12 | 56 | 7 | 12 | 54 |
| Comparative Example 3 | 57 | 49 | 38 | 53 | 48 | 40 | 51 | 46 | 38 |

Figure 2:
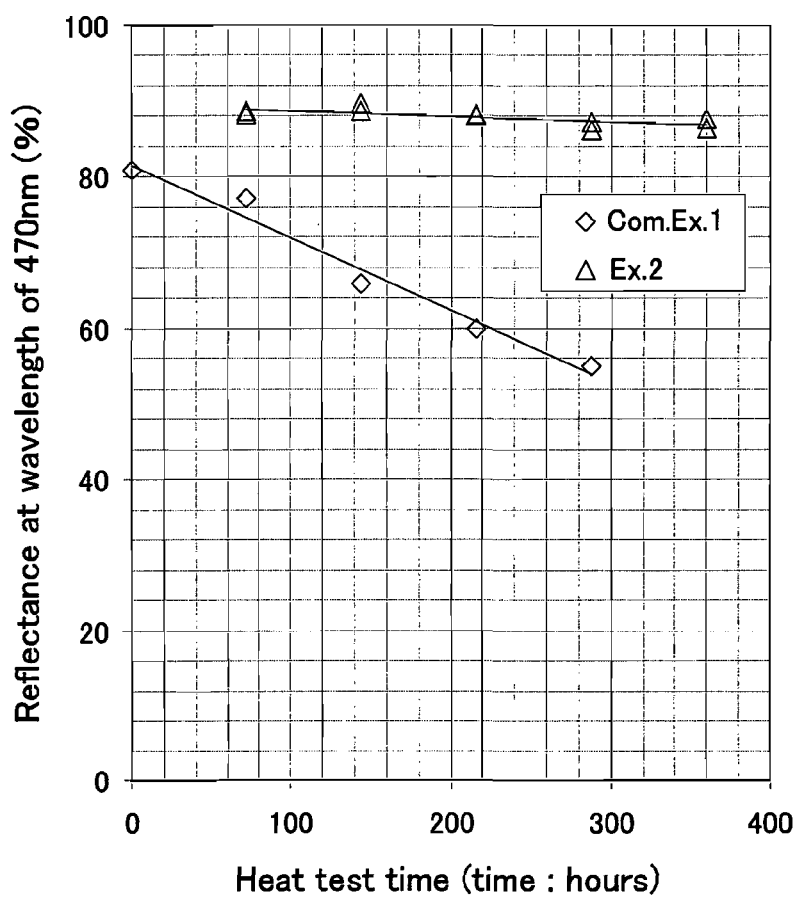
FIG. 2 is a graph showing changes in the reflectance of thermally conductive sheets of Example 2 and Comparative Example 1 during a heat test.

FIG. 2 shows changes in the reflectance of the thermally conductive sheets of Example 2 and Comparative Example 1 during the heat test at 120° C. In FIG. 2, the horizontal axis represents the length of time that has elapsed since the start of the heat test, and the vertical axis represents the reflectance at a wavelength of 470 nm.

As is clear from Table 2 and FIG. 2, the thermally conductive sheets of Examples maintained their high reflectances even after the heat tests. On the other hand, the reflectance of the thermally conductive sheet of Comparative Example 1 significantly decreased after the heat tests, although it was relatively high before the heat tests. These results show that the substrate of the present invention is less susceptible to degradation by heat generation due to LEDs and by harsh outdoor environments and can maintain its high reflectance.

INDUSTRIAL APPLICABILITY

The present invention can be used for LED mounting substrates, and modules, light sources, devices and the like using the substrates.

The invention claimed is:

1. An LED mounting substrate, comprising:
   a layer made of a composition containing boron nitride powder and a fluororesin, wherein
   the fluororesin contains polytetrafluoroethylene,
   the layer has a thermal conductivity of 2 W/(m·K) or more,
   the layer has a reflectance of 0.80 or more at wavelengths of 380 nm, 470 nm, and 650 nm,
   a content of the boron nitride powder in the composition is in a range of 80 to 90% by mass,
   a content of the fluororesin in the composition is in a range of 10 to 20% by mass,
   the fluororesin further contains a fusible fluororesin, and
   a content of the fusible fluororesin in the fluororesin is in a range of 5 to 50% by mass.

2. The LED mounting substrate according to claim 1, wherein the fusible fluororesin contains at least one selected from the group consisting of perfluoroalkoxy fluororesins and tetrafluoroethylene-hexafluoropropylene copolymer.

3. The LED mounting substrate according to claim 1, further comprising a wiring pattern formed on a surface of the layer.

4. The LED mounting substrate according to claim 1, disposed on a radiator.

5. The LED mounting substrate according to claim 1, wherein the layer has a porosity ranging from 5 to 30% by volume.

6. The LED mounting substrate according to claim 1, wherein the layer has a reflectance of 0.80 or more at wavelengths of 380 nm, 470 nm, and 650 nm after heating at 200° C. for 72 hours, and a reflectance of 0.80 or more at wavelengths of 380 nm, 470 nm, and 650 nm after heating at 120° C. for 360 hours.

7. The LED mounting substrate according to claim 1, wherein the boron nitride powder contains an aggregate of flaky boron nitride particles.

\* \* \* \* \*